United States Patent [19]
Singer et al.

[11] Patent Number: 6,118,270
[45] Date of Patent: Sep. 12, 2000

[54] APPARATUS FOR FAST MEASUREMENTS OF CURRENT AND POWER WITH SCALEABLE WAND-LIKE SENSOR

[76] Inventors: Jerome R. Singer, 2917 Avalon Ave., Berkeley, Calif. 94705; Joel M. Libove, 34 Canyon View Dr., Orinda, Calif. 94563

[21] Appl. No.: 09/025,043

[22] Filed: Feb. 17, 1998

[51] Int. Cl.[7] .............................. G01R 1/20; G01R 15/00
[52] U.S. Cl. ...................... 324/117 R; 324/115; 324/127
[58] Field of Search .................... 324/115, 127, 324/123 R, 122, 126, 142, 117 R, 72.5

[56] References Cited

U.S. PATENT DOCUMENTS

| | | | |
|---|---|---|---|
| 3,611,339 | 10/1971 | Richey et al. | 324/122 |
| 3,986,116 | 10/1976 | Smith et al. | 324/127 |
| 4,314,201 | 2/1982 | Marro et al. | 324/127 |
| 4,321,529 | 3/1982 | Simmonds et al. | 324/127 |
| 4,454,557 | 6/1984 | Hurley | 324/127 |
| 4,471,300 | 9/1984 | Harnden et al. | 324/127 |
| 4,558,310 | 12/1985 | McAllise | 324/127 |

*Primary Examiner*—Diep N. Do
*Attorney, Agent, or Firm*—Howard Cohen

[57] ABSTRACT

A device for non-contact, non-invasive measurement of current or power in a wire, cable or conductor includes a small coil having multiple turns and no ferromagnetic core. The coil may be secured to a wand or housing adapted to be used to place the coil in close proximity to the wire, cable or conductor, whereby a voltage is induced in the coil. An amplifier may be utilized to increase sensitivity. A readout indicates the magnitude of the induced voltage, and a scaling device renders the readout display indicative of the current or power in the wire, cable, or conductor. To measure direct current flow, the coil may be vibrated or rotated adjacent to the conductor to cause the magnetic field to induce a voltage in the coil. The readout may comprise a digital display, a series of light emitting devices, or a flashing light emitting device having a flash rate proportional to the magnitude of the voltage. The device may be constructed in a wand or pen-like fashion, with the coil incorporated into the wand. The device may be combined with a voltage sensor.

22 Claims, 5 Drawing Sheets

APPARATUS FOR FAST MEASUREMENTS OF CURRENT AND POWER WITH SCALEABLE WAND-LIKE SENSOR

FIELD OF THE INVENTION

The field of the invention is the measurement of electrical current and/or apparent or real power in wires, cables or other conductors without any contact with the wires, cables, or other conductors. The system may be combined with voltage sensing probes.

BACKGROUND OF THE INVENTION

Present methods of non-contact current measurements in conductors often consists of the use of iron or other ferrous types of magnetic materials configured so as to couple the magnetic field surrounding a current carrying conductor in a transformer configuration. These present methods are often accurate and are widely employed in measuring a.c. currents in wires and other electrical conductors. The generic term for the instruments now widely employed is "current clamp", or "clamp-on current probe". These provide a means of rapidly measuring the a.c. current by surrounding the conductor with a magnetic circuit which is configured as a transformer which is designed for a convenient ratio for measurement to provide, for example, one milliampere per ampere, or one millivolt per ampere. The output of these clamp-on current probes is then read out on a meter or attached via wires to a multimeter. Manufacturers and distributors of such clamp-on current probes are, for example, Fluke Corporation, Amprobe Instruments, AEMC Instruments, Fieldpiece Corporation, Hewlett-Packard Corporation, and many others. A second common non-contact method of measuring current utilizes the Hall effect. A Hall element placed in the region of a magnetic field provides an output voltage proportional to the field. Hall element devices are often utilized for both a.c. and d.c. non-contact current measurements in wires and other conductors and are also widely available from these same manufacturers and distributors of a.c. clamp-on current probes.

The use of a ferromagnetic material in a non-contact current probe provides the advantage that good accuracy is often obtained. The major disadvantages are that these clamps require complete access to the wire or conductor so that the current clamp must completely surround the wire or conductor, that the characteristics of the ferromagnetic material are non-linear, the process of taking a reading is slow, and the current clamps are large, awkward and sometimes impossible to use when wires are in confined spaces.

In practice, for many cases, the electrical worker cannot easily surround a conductor with a conventional current clamp because the conductor or wire may be fastened to, or very close to a wall or ceiling and it would be awkward and very inconvenient to use a current clamp. Also, in some cases, the non-linearity can be a serious problem when large as well as very small currents are to be measured because the hysteresis curve of ferromagnetic types of materials is, in general, non-linear, and will cause reading errors.

Non-contact voltage sensing instruments are now often employed by many electrical workers. These instruments provide a rapid indication of the existence of a voltage on an insulated wire by simply bringing the tip of the instrument close to or touching an insulated or bare wire carrying voltage. Thousands of such instruments are utilized in the electrical industry to determine whether or not there is a voltage on the wire or conductor. Usually these instruments light a light emitting diode, (LED), and/or sound a buzzer. Some of these instruments can distinguish between 120 volts, 240 volts, and 480 volts. Some of these instruments can determine the voltage accurately.

Basically, these instruments are in common use because they are inexpensive, pocket-sized, and provide a very quick decision of when a wire, conductor, or terminal is "hot", (has voltage), and is not.

Many of these voltage sensors are very simple in design. Typically, they utilize a digital IC gate which is triggered by a pulse input. The IC then lights an LED to indicate the presence of an a.c. voltage. Because of their simplicity, low cost, and pocket size, these devices are widely employed in electrical industries. Other types of voltage sensors are also employed which are more accurate and more complex.

The present invention provides means to overcome the disadvantages of the conventional current clamp and provides a quick indication of the current flow or of the power by simply touching the insulated or bare conductor or wire with the probe as described below. By combining the current probe described here with a voltage sensor, the electrical worker will be provided with a much more versatile pocket sized instrument, and can measure power also. In many cases, the voltage is constant, and the apparent power is easily determined by scaling the output voltage to read out the power output directly.

SUMMARY OF THE INVENTION

The present invention utilizes the magnetic field surrounding a current carrying conductor. By providing coupling to that magnetic field, without employing a ferromagnetic transformer, the current can be measured. The probe design can take a number of different forms. In one form, the insulated probe is placed close to, or touched to an insulated or a bare wire or other conductor, and the induced voltage or current in the probe is used to provide an output reading which is proportional to the current in the wire or conductor. The output reading is then scaled to read out the actual current in the wire, cable or other conductor. Alternatively, the scale may be set to read out the apparent or real power. In another form, the spacing of the probe is set exactly for known distances and the voltage or current induced in the probe is then exactly proportional to the current in the insulated wire or conductor, and a properly scaled voltage readout will provide the exact current in the wire or conductor. Such a probe, secured to a wire, cable or other conductor can provide a monitoring system for the current or the power.

For d.c. measurements, the probe should be moved towards or away from the current carrying conductor, or rotated next to the conductor, and the output voltage can then be read out. The output voltage is proportional to the current.

In some cases, nearby current carrying wires or conductors cause the output reading of a wire under measurement to be increased or decreased from the true value. By employing one or more ferromagnetic or mu metal shields placed around the nearby wires the measurements may still be carried out with some accuracy. This procedure of shielding neighboring wires from a desired measurement in one selected wire allows the measurement of current when there is a wire bundle.

These current probes are pocket sized and are a quick measure of the approximate current. There is a need for these convenient features. Furthermore, the current probes may be combined with the voltage sensor probes and thereby provide the electrical worker with a means of sensing voltage, and measuring the current and the power.

DETAILED DESCRIPTION OF PREFERRED EXEMPLARY EMBODIMENTS

Figure 1A:
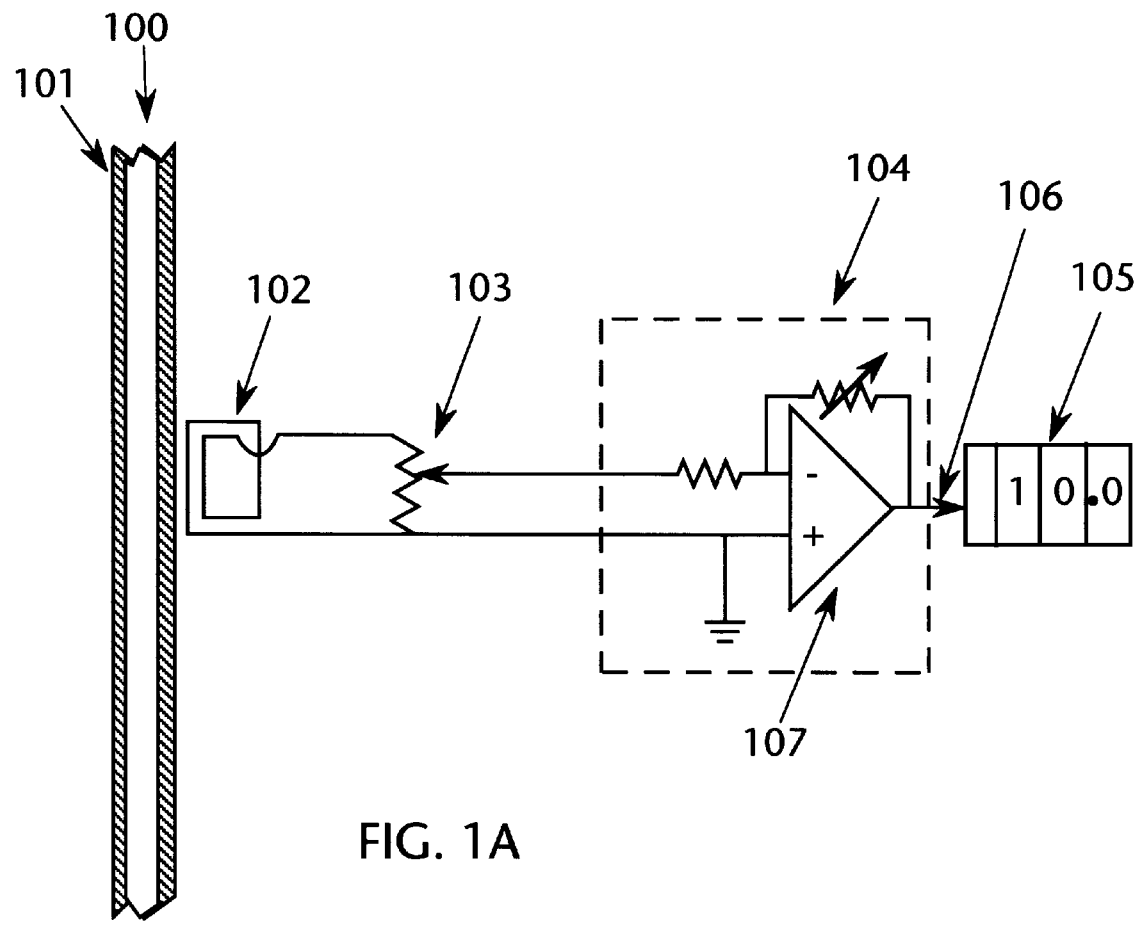
FIG. 1A is a drawing of one embodiment of the invention where the a.c. current flowing in a wire induces a voltage in the probe coil which is then scaled or amplified to provide an output to a meter.

Referring to FIG. 1A, the a.c. current flow in the wire or conductor 100 which may have insulation 101 is unknown. The small multi-turn coil 102, which is called the pickup coil, is placed next to the insulated, (or even bare), wire 100. Due to the magnetic field surrounding the wire, an a.c. voltage is induced in the coil 102. The value of the voltage in coil 102 is easily calculated using Maxwell's equations.

The potentiometer or variable resistor 103 may be used to scale or adjust the voltage so as to provide an output voltage 106 which is proportional to the current 100. By connecting 106 with a voltage or a multimeter meter 105, the output reading is obtained, for example 10.0 may indicate that the current in the wire 100 is 10.0 Amperes. The dotted lines 104 which border an operational amplifier with adjustable gain 107 may be utilized in event that a larger voltage output is desired.

Due to the perfect linearity of the Maxwell equation governing the voltage in the coil, when the system is calibrated for a single fiducial current in the wire, it will remain in calibration for all current values in that wire. As an example, the output voltage may be accurately calibrated to provide one millivolt output reading for every ampere flowing in the wire, or if desired, ten or more millivolts output reading for every ampere in the wire. The entire probe which is composed of items 102, 103, 106, and if desired, 104 is a very small unit about the size of a fountain pen. In fact, the readout meter 105 can also be designed to be a part of the probe and still maintain an overall size of a fountain pen. The use of such a non-contact easily portable instrument is very helpful in the electrical industry as well as the aircraft, boating, air conditioning, refrigeration, and heating industries. The ability to quickly determine that wires have measurable current flow provides considerable aid to the maintenance workers and trouble shooters.

Figure 1B:
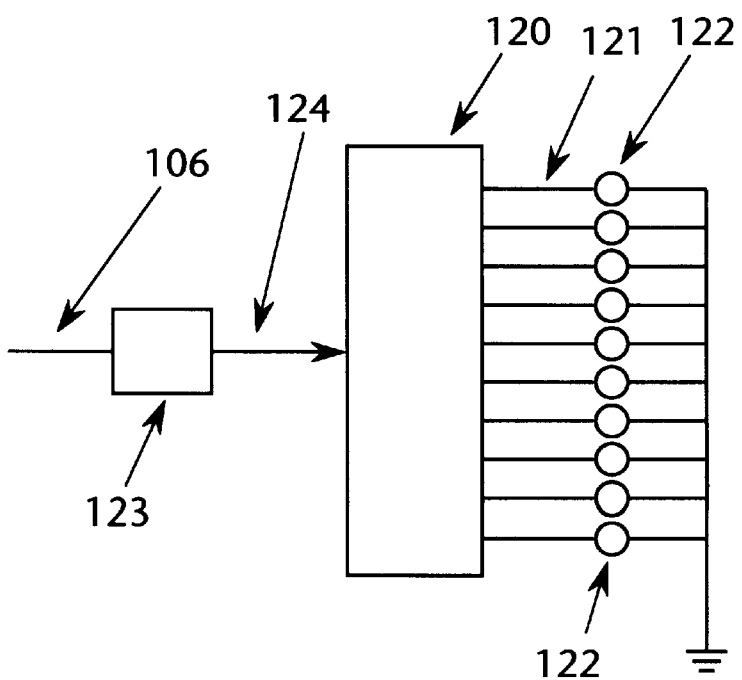
FIG. 1B is a drawing of a second embodiment of the invention where the scaled output is used to drive a standard integrated circuit driver for LED indicator lamps.

FIG. 1B shows an alternative readout system. Here the output voltage 106 is rectified by the rectifier 123 and then drives an integrated circuit, 120, (such as the National Semiconductor Corporation LM 3915), which in turn has ten output lines 121. the output lines of the drive the light emitting diodes 122. The advantage of this output is that it is more economical to manufacture and more easily read in low light levels. Each of the LED diodes are designed to light up as the current increases. For example, one lighted LED would light up for one ampere in the wire, two LED's for two amperes, and so forth. Alternatively, a more economical readout system could utilize the rectified voltage to drive one or a group of LED's using a resistor ladder network. That would provide approximate current indications in which the brightness of the LED's would indicate relative current values for rapid relative currents.

Figure 2:
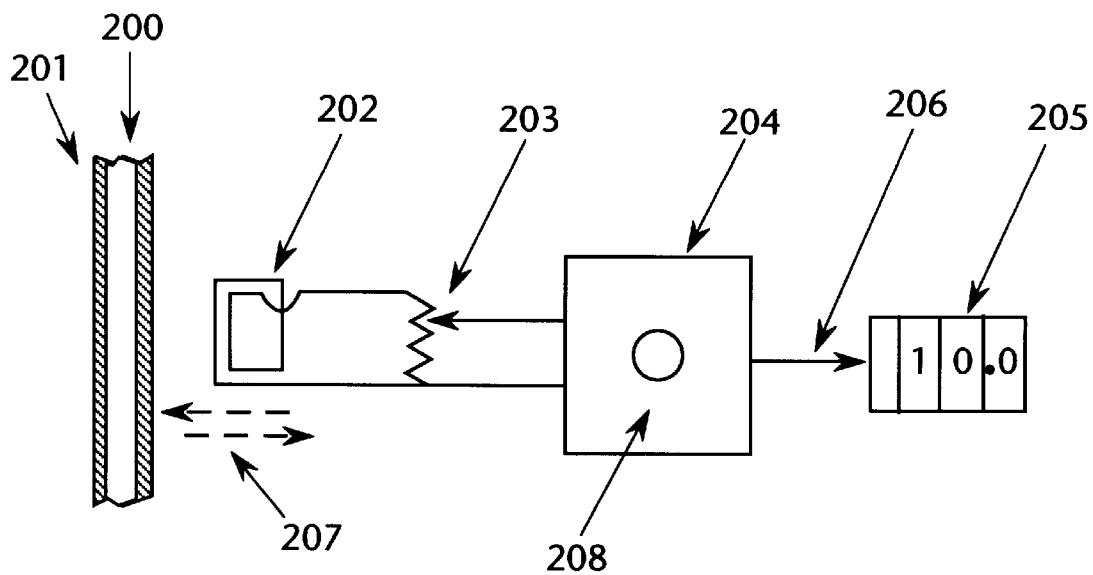
FIG. 2 is a drawing of a third embodiment of the invention where the probe is moved close to the wire or conductor and then vibrated or rotated. The induced voltage is scaled and read out as a voltage which is proportional to the current in the wire or conductor.

FIG. 2 shows a system designed to measure currents in d.c. wires or conductors. Here a d.c. current flows through the wire 200 which may have insulation 201. The insulated multi-turn coil 202 is positioned next to the wire or conductor, and the amplifier circuit 204 is zeroed by means of a push-button switch 208 which same switch turns on a vibrating mechanism which provides the motion 207, which causes the coil 202 to move alternatively away and towards the wire or conductor 200. The vibrating mechanism may be a small linear motor, a piezo-electric crystal, or a magnetostrictive drive. Alternatively, the coil may be driven in a rotation about its axis by a small electric or pneumatic motor also. In the latter case, the coil voltage can be coupled out with slip rings or by a rotating transformer coupling. Once again the entire probe can be manufactured in a very small pocket sized package which is very convenient for the electrical worker.

Due to the motion of the pickup coil 202, according to Maxwell's equations, a voltage appears at the potentiometer 203. The potentiometer is utilized to scale the voltage so that it is a convenient ratio for determining the readout value 205.

In addition, a calibrated amplifier 204 may be provided to more easily obtain output values 206 which drive the readout voltmeter 205. Once again, the readout can be a small integral voltmeter, or a cable can be provided to connect to a standard multimeter.

The pickup coil is more efficient in coupling to the wire or conductor when more of the turns of the coil are as close as possible to the wire or conductor.

For example, the rectangular coil shape shown in FIGS. 1A, 1B, 2, and 3 are more efficient than a circular coil. Other shapes which tend to keep the coil area very close to the wire are also efficient, keeping in mind that the closer the turns of the coil are to the wire or conductor, the better the efficiency of the coupling, and the less there is interference from the fields of neighboring wires.

This invention can be implemented in pocket sized non-contact current reading systems designed for electrical workers usually working with 50/60 or 400 Hertz frequencies, where the voltages are generally 120, 240, or 480 volts and the currents are generally anywhere from a fraction of an ampere to a few thousand amperes. Recently we have built several models and have field tested them. They have proven to be a substantial aid to quickly determine the current flows in various electrical wiring configurations. In addition, these probes are scaleable so that by means of setting the gain, they may be used to directly read out the power in all of the cases where the voltage is constant and/or is known and/or measured.

Figure 3:
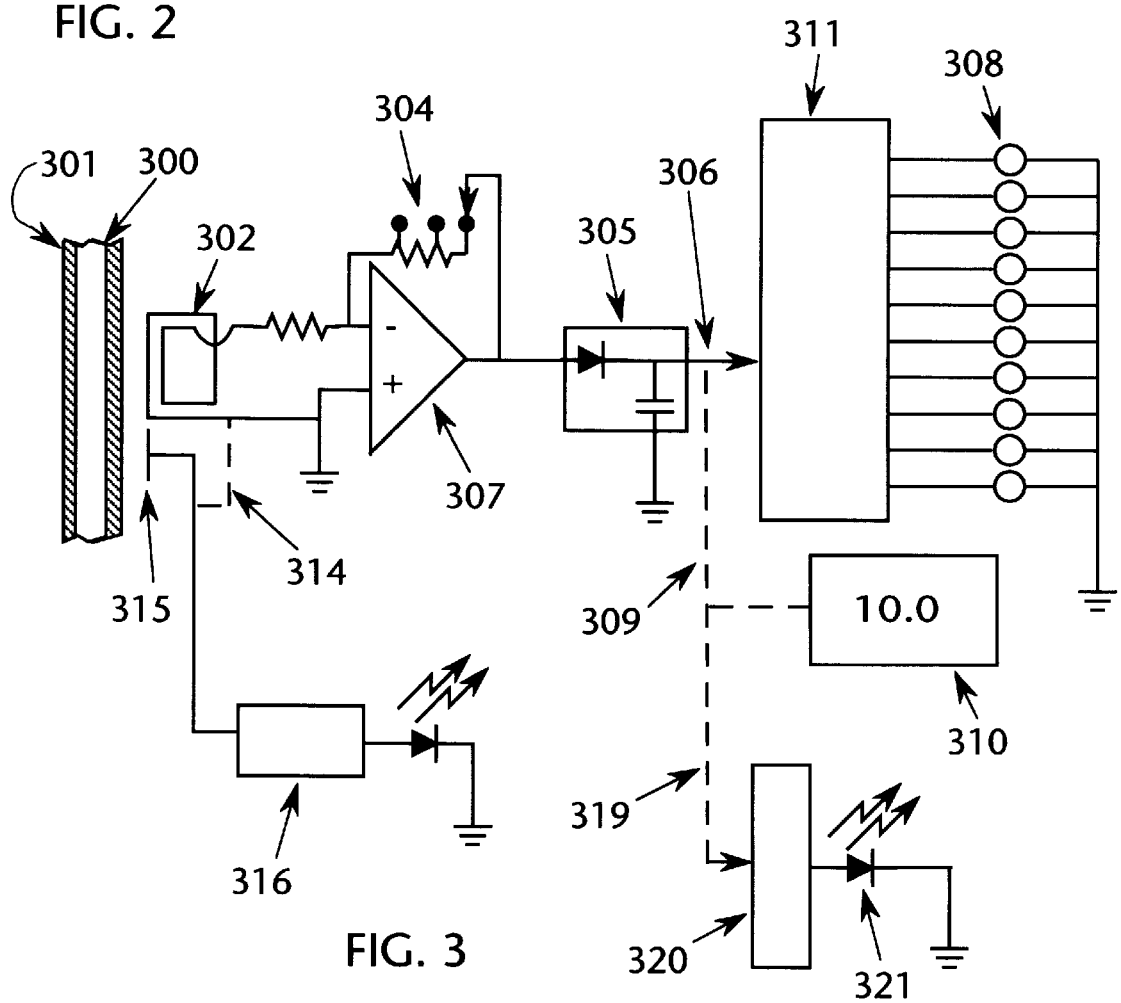
FIG. 3 is a drawing of the current sensing system in combination with a type of voltage sensor. The combination provides a means of measuring current and voltage all in one pocket sized instrument.

FIG. 3 shows the current measurement system in combination with a voltage sensor. The two measurements are now combined in one pocket sized instrument. The wire or conductor 300 with insulation 301 has a voltage on it, and current flows through it. The current is sensed by the pickup coil 302 which coil can be made very small because its output is amplified by the amplifier 307 which has a variable adjustable gain 304. The output of the amplifier 307 is rectified by a rectifier 305 providing an output on line 306 which can drive one or several readout devices. The IC 311 is a National Semiconductor LM3915 or similar IC which is designed to drive ten LED's. Each of the LED's indicate a different current value. For example, the first LED can be scaled to light when the current is one Ampere, the second LED would light when the current is two Amperes, etc., and the tenth LED would light when the current is ten Amperes. Alternatively, the gain may be set to provide indications of 100 watts, 200 watts, 300 watts, etc. as long as the voltage is constant or is known.

Alternatively, Line 309 can drive a conventional Liquid Crystal Display, (LCD), voltmeter which are now very small and can be incorporated in a pen-sized instrument. In addition, if desired, other types of voltage measurement systems may be utilized. For example, the line 309 may be a short extended wire which can be plugged into a conventional multimeter to read out the current with more accuracy.

An alternative type of output reading which has the virtue of low cost is the flashing LED 321 which is driven by a voltage to frequency integrated circuit 320 which is a standard IC, such as, for example, the TelCom 9400 or 9401 or 9402. The voltage to frequency converter is connected by a wire 319 to the rectifier circuit 305. The voltage to frequency converter provides pulse outputs to the LED 321 which flashes at a rate proportional to the current in the wire 300. For example, for one ampere, the flashing may be set at one flash per two seconds, for two amperes, the flashing may be set at two flashes per two seconds, etc., to ten flashes per two seconds for indicating a current of ten amperes. The flashing system can readily be engineered for a pause between the sets of flashes to simplify the readout interpretation.

At the same time, electrode 315 is capacitively coupled to the current carrying wire 300 either a connection 314 to the coil 302 or by means of a small plate 315. The capacitive coupling to the a.c. on wire 300 triggers one of the gates on the IC 316 which is, for example, a Motorola MC14069. The IC 316 then drives an LED 317 which indicates that voltage is on the wire 300. This configuration provides voltage indication.

Figure 4:
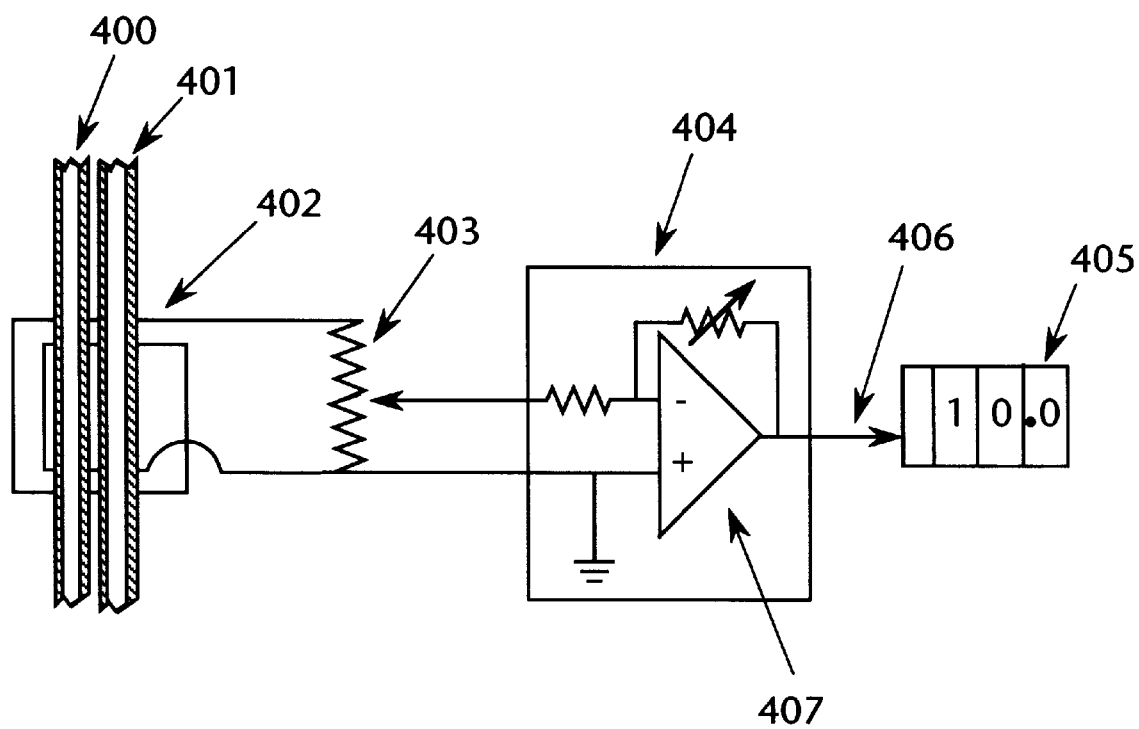
FIG. 4 is a drawing of the current sensing system utilized for measuring the current in a multiwire cable.

FIG. 4 shows the use of the same system for measurements with wire cables consisting of two or more wires. Insulated wire 400 is paired with insulated wire 401. The wire pair may be any type from lampcord to Romex. The multi-turn pickup coil 402 is held so that the center line of the cable is centered over the pickup coil. This position usually provides a larger pickup voltage than other positions. The voltage picked up by coil 402 is scaled or calibrated by potentiometer 403 and may also be amplified by the amplifier 404 which has adjustable gain for further scaling or calibration. The output voltage 406 is then used to drive a multimeter or voltmeter or other voltage indicating system 405. The use of the same coil for both single wires and wire bundles is a significant advantage for the electrical worker.

Figure 5A:
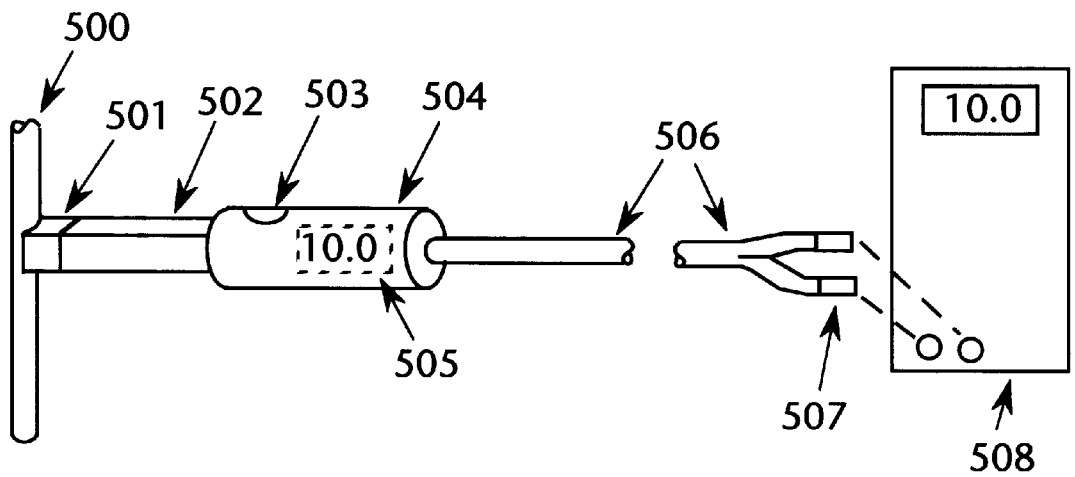
FIG. 5A is a drawing of an embodiment of the invention schematically showing a form of the invention for use by electrical workers for the measurement or indication of current flow in an individual wire.

FIG. 5A shows the system in one form suitable for use by electrical workers. The probe which consists of a multi-turn coil enclosed in plastic is touching an insulated current carrying wire 500. The plastic casing 502 may enclose an amplifier if desired. The handle 504 encloses a calibration potentiometer which is adjustable through the small hole 503. The readout may be integral to the handle as in 505, or may be separately attached by means of the cable 506 which is attached by connectors 507 to a multimeter or a voltmeter 508. In this form which may or may not also enclose a voltage sensor, the electrical worker is provided with a convenient pocket sized current indicator to facilitate trouble shooting or maintenance. In addition, the same enclosure 502 may enclose a voltage sensing or voltage measuring instrument so as to provide a compact, multiple purpose, more useful instrument for the electrical worker. By knowing or measuring the voltage, the probe may be set to read out the power directly since the product of the voltage and current equals the apparent power. Furthermore, by knowing both the voltage and the power factor, the scale may be set so that the readout will provide the true power.

Figure 5B:
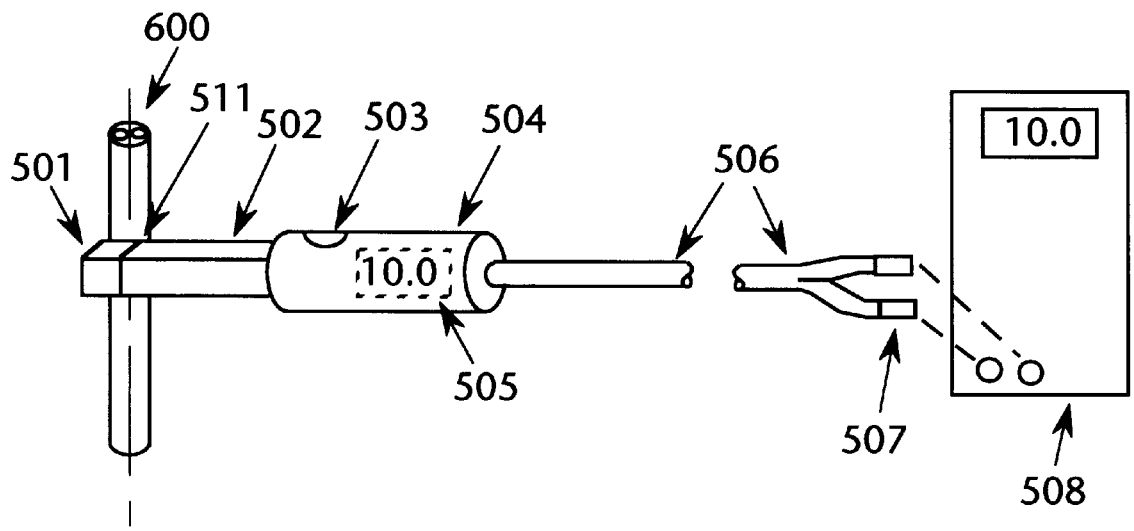
FIG. 5B is a drawing of an embodiment of the invention schematically showing a form of the invention for use by electrical workers for the measurement or indication of current flow in a cable consisting of several wires.

FIG. 5B shows the same system as 5A except that the same probe labeled 501 is now used to measure the current in a multi-conductor cable 600. Here the probe is placed with the marker line 511 over the current carrying cable 600. The pickup coil center labeled 511 and denoted by a line on the plastic cover is placed over the center of the cable. That is to say it is centered between the two wires of the cable. In this way, the current in cables can be measured with the same invention. The invention provides current measurements in cables as well as in single wires. Here the rest of the apparatus is just the same as in FIG. 5A, and is so labeled. There is considerable advantage to the electrical worker to having a single instrument which may be used for both current measurements in single current carrying wires and in current carrying cables.

Figure 6A:
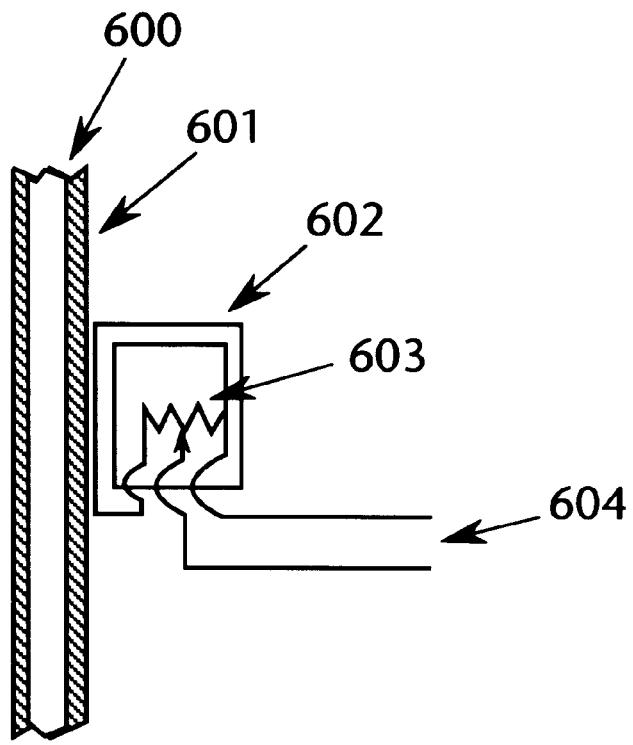
FIG. 6A is a drawing of an embodiment of the invention showing a current or power monitor fastened to a wire with an optional potentiometer within the pickup coil for accurately scaling the output.

FIG. 6A shows a current carrying wire or conductor 600 which may or may not be insulated with insulation 601. A pickup coil 602 is positioned and secured to the wire 600 so as to provide a voltage pickup proportional to the current in the wire. The number of turns and the positioning of the pickup coil may be used as a scaling factor to obtain a voltage output 604 which represents the current exactly, that is for example one millivolt per Ampere, or some other convenient scale. However, it may be more convenient to provide a potentiometer 603 fastened within the pickup coil as schematically shown to adjust the scaling factor. The voltage output 604 then provides a convenient scaled number of millivolts per Ampere or per Watt.

Figure 6B:
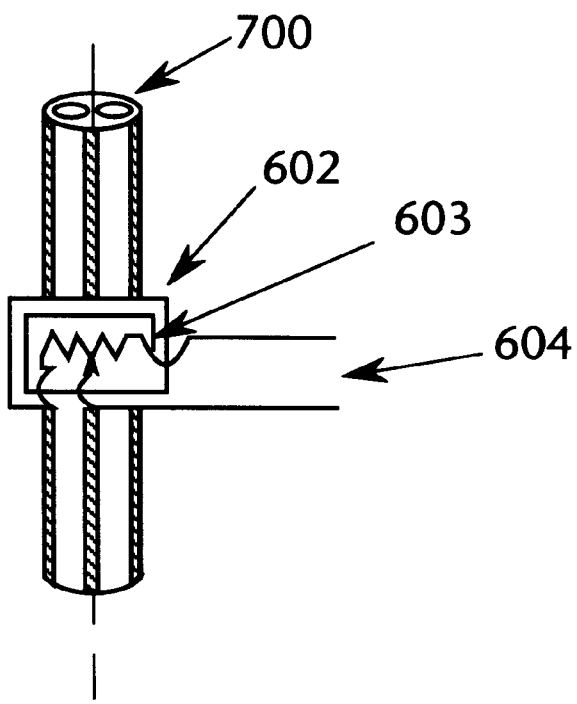
FIG. 6B is a drawing of an embodiment of the invention showing a current or power monitor fastened to a cable with an optional potentiometer within the pickup coil for accurately scaling the output.

FIG. 6B shows a current carrying cable 700 of two insulated wires. Positioned on the cable is the pickup coil 602 which is the same as in FIG. 6A. Once again, the coil design and placement may be used to provide a scaling factor or the potentiometer 603 mounted within the coil may be used to provide a convenient scaling factor for the voltage output 604.

The use of a pickup coil follows Maxwell's equations, and in particular, Faraday's Law of Induction, which is also known as Lenz's Law which is:

$$V = -N \, df/dt \qquad 1.$$

Where N is the number of turns of the pickup coil, and f is the magnetic flux which surrounds the wire. The time rate of change of flux induces the voltage, V. The flux f is given by:

$$f = BA \qquad 2.$$

Where the magnetic flux f, which is enclosed by the area of the pickup coil, equals the value of the local magnetic field B times the Area A of the pickup coil.

Since the value of B is determined exactly by the current flowing in a wire, and the time rate of change is determined by the a.c. frequency on the wire which is exact also, the pickup coil will have a voltage which is dependent on the following factors: the area, the number of turns, the spacing from the wire or conductor, and the neighboring fluctuating magnetic fields. These factors can be designed as constants, corrected for, or can be scaled or calibrated prior to reading the readout device as described above.

An economical current and/or power monitor for wires, cables, and conductors may be easily constructed by securing the pickup coil to said wires, cables, or conductors at a fixed distance, appropriately positioned as described in FIGS. 1, 2, 3, and 4. Such a current and/or power monitor may be appropriately scaled with a potentiometer and will provide very accurate current or power readouts for total energy monitoring The foregoing description of the preferred embodiment of the invention has been presented for purposes of illustration and description. It is not intended to be exhaustive or to limit the invention to the precise form disclosed, and many modifications and variations are possible in light of the above teaching without deviating from the spirit and scope of the invention. The embodiment described is selected to best explain the principles of the invention and its practical application to thereby enable others skilled in the art to best utilize the invention in various embodiments and with various modifications as suited to the particular purpose contemplated. It is intended that the scope of the invention be defined by the claims appended hereto.

What is claimed is:

1. A device for non-contact measurement of AC current flow in a conductor, including:

a coil having a plurality of turns of wire;

means for placing said coil in close proximity to the conductor, whereby a voltage is induced in said coil;

means for displaying said voltage;

means for scaling the output of said means for displaying to be representative of the current flowing in the conductor;

said coil including a central opening about which said turns are wound; and, said means for scaling the output being secured in said central opening.

2. The device of claim 1, wherein said means for scaling the output comprises a potentiometer disposed in said central opening.

3. The device of claim 1, further including non-contact means for remote sensing of the AC voltage on the conductor;

means for indicating the presence of the AC voltage on the conductor, said means for non-contact remote sensing being connected to drive said means for indicating the AC voltage on the conductor.

4. The device of claim 3, wherein said means for remote sensing includes a capacitive sensor disposed in close proximity to the conductor.

5. The device of claim 1, further including means for increasing the efficiency of said coil, said means for increasing the efficiency including a linear portion of said coil in which said turns of wire extend substantially parallel and linearly, said linear portion being alignable with the conductor.

6. A device for non-contact measurement of AC current flow in a conductor, including:

a coil having a plurality of turns of wire;

means for placing said coil in close proximity to the conductor, whereby a voltage is induced in said coil;

means for displaying said voltage;

means for scaling the output of said means for displaying to be representative of the current flowing in the conductor;

a generally tubular pen-like housing having opposed ends, said coil secured at one end of said housing, said means for displaying being secured to said housing.

7. The device of claim 6, wherein said means for displaying said voltage includes a display having a plurality of digits.

8. The device of claim 6, wherein said means for displaying said voltage includes a plurality of light emitting devices, and further including means for illuminating a variable number of said plurality of light emitting devices, said variable number being proportional to said voltage.

9. The device of claim 6, wherein said means for displaying said voltage includes a voltage-to-frequency converter connected to receive said voltage and produce an output signal having a frequency proportional to said voltage, and a light emitting device connected to receive said output signal and to flash at a rate proportional to said voltage.

10. The device of claim 9, wherein said means for scaling the output includes an adjustable gain control for said means for amplifying said voltage.

11. The device of claim 6, further including means of amplifying said voltage and conducting the amplified voltage to said means for displaying said voltage.

12. The device of claim 6 wherein said coil is wound about an axis and further including means for demarcating a centerline on the exterior of said coil, said centerline generally coinciding with said axis, whereby said coil may be positioned in registration with the center of a multiple conductor electrical cable.

13. A device for non-contact measurement of DC current flow in a conductor, including:

a coil having a plurality of turns;

means for placing said coil in close proximity to the conductor;

means for moving said coil with respect to the conductor, whereby a voltage is induced in said coil;

means for displaying said voltage; and, means for scaling the output of said means for displaying to be representative of the current in the conductor.

14. The device of claim 13, wherein said means for scaling the output of said display includes means for scaling the output to be representative of the power in the circuit.

15. The device of claim 13, wherein said means for moving said coil comprises vibrating means for moving said coil reciprocally at a generally constant rate.

16. The device of claim 13, wherein said means for moving said coil comprises means for rotating said coil at a generally constant angular velocity.

17. A device for non-contact measurement of AC current flow in a conductor, including:

a coil having a plurality of turns of wire;

means for placing said coil in close proximity to the conductor, whereby a first voltage is induced in said coil;

means for displaying said first voltage;

means for scaling the output of said means for displaying to be representative of the current flowing in the conductor;

non-contact means for remote sensing of an AC voltage on the conductor;

means for indicating the presence of an AC voltage on the conductor, said means for remote sensing being connected to drive said means for indicating the presence of an AC voltage on the conductor.

18. The device of claim 17, wherein said means for remote sensing includes a capacitive sensor lead disposed in close proximity to the conductor.

19. The device of claim 18, wherein said capacitive sensor lead is capacitively connected to said coil.

20. The device of claim 17, wherein said means for indicating includes a light emitting device.

21. A device for non-contact measurement of AC current flow in a conductor, including:

a coil having a plurality of turns of wire;

means for placing said coil in close proximity to the conductor, whereby a first voltage is induced in said coil;

means for displaying said first voltage;

means for scaling the output of said means for displaying to be representative of the current flowing in the conductor;

means for increasing the efficiency of said coil, said means for increasing the efficiency including a linear portion of said coil in which said turns of wire extend substantially parallel and linearly, said linear portion being alignable with the conductor.

22. The device of claim 21, wherein said coil includes a general quadrilateral configuration.

* * * * *